United States Patent
Horikawa et al.

(10) Patent No.: US 8,501,027 B2
(45) Date of Patent: Aug. 6, 2013

(54) POLISHING COMPOSITION AND POLISHING METHOD

(75) Inventors: Chiyo Horikawa, Kakamigahara (JP); Koji Ohno, Motosu-gun (JP); Kazusei Tamai, Willsonville, OR (US)

(73) Assignee: Fujimi Incorporated, Nishikasugai-gun, Aichi (JP)

( * ) Notice: Subject to any disclaimer, the term of this patent is extended or adjusted under 35 U.S.C. 154(b) by 1349 days.

(21) Appl. No.: 11/969,493

(22) Filed: Jan. 4, 2008

(65) Prior Publication Data
US 2008/0233836 A1 Sep. 25, 2008

Related U.S. Application Data

(63) Continuation of application No. 11/065,238, filed on Feb. 24, 2005, now abandoned.

(51) Int. Cl.
*B44C 1/22* (2006.01)
*H01L 21/302* (2006.01)

(52) U.S. Cl.
USPC .............. 216/89; 216/88; 438/692; 438/693; 451/41

(58) Field of Classification Search
USPC ................. 216/88, 89; 438/692, 693; 451/41
See application file for complete search history.

(56) References Cited

U.S. PATENT DOCUMENTS

| | | |
|---|---|---|
| 5,516,346 A | 5/1996 | Cadien et al. |
| 5,527,423 A | 6/1996 | Neville et al. |
| 5,575,837 A | 11/1996 | Kodama et al. |
| 5,909,820 A | 6/1999 | Yeh |
| 5,958,288 A | 9/1999 | Mueller et al. |
| 5,993,686 A | 11/1999 | Streinz et al. |
| 6,001,269 A | 12/1999 | Sethuraman et al. |
| 6,117,783 A | 9/2000 | Small et al. |
| 6,136,711 A | 10/2000 | Grumbine et al. |
| 6,293,848 B1 | 9/2001 | Fang et al. |
| 6,313,039 B1 | 11/2001 | Small et al. |
| 6,319,096 B1 | 11/2001 | Mueller et al. |
| 6,328,774 B1 | 12/2001 | Shemo et al. |
| 6,340,374 B1 | 1/2002 | Kato et al. |
| 6,491,837 B1 | 12/2002 | Liu et al. |
| 6,527,817 B1 | 3/2003 | Fang et al. |
| 6,716,755 B2 | 4/2004 | Fang et al. |

(Continued)

FOREIGN PATENT DOCUMENTS

| | | |
|---|---|---|
| EP | 1405886 A1 | 4/2004 |
| JP | 1067986 | 3/1998 |

(Continued)

*Primary Examiner* — Shamim Ahmed
(74) *Attorney, Agent, or Firm* — Vidas, Arrett & Steinkraus, P.A.

(57) ABSTRACT

A polishing composition includes more than 0.1% by mass of colloidal silica, and water, and has a pH of 6 or less. The polishing composition has the ability to polish a titanium material at a high stock removal rate. Thus, the polishing composition is suitable for use in applications for polishing a titanium-containing object.

12 Claims, 1 Drawing Sheet

U.S. PATENT DOCUMENTS

| | | | |
|---|---|---|---|
| 6,740,589 B2 * | 5/2004 | Shimazu et al. | 438/691 |
| 6,814,766 B2 | 11/2004 | Ohno et al. | |
| 6,849,099 B2 | 2/2005 | Ohno et al. | |
| 7,189,684 B2 | 3/2007 | Ohno et al. | |
| 7,524,347 B2 * | 4/2009 | Sun et al. | 51/307 |
| 2002/0023389 A1 | 2/2002 | Minamihaba et al. | |
| 2002/0111024 A1 | 8/2002 | Small et al. | |
| 2003/0079416 A1 * | 5/2003 | Ma et al. | 51/307 |
| 2003/0194953 A1 * | 10/2003 | McClain et al. | 451/41 |
| 2004/0009671 A1 | 1/2004 | Kaufman et al. | |
| 2004/0023607 A1 * | 2/2004 | Talieh et al. | 451/296 |
| 2004/0154230 A1 * | 8/2004 | Wang et al. | 51/307 |
| 2004/0157535 A1 | 8/2004 | Chaneyalew et al. | |
| 2004/0192049 A1 | 9/2004 | Ohno et al. | |
| 2004/0221516 A1 * | 11/2004 | Cho et al. | 51/308 |
| 2005/0178742 A1 | 8/2005 | Chelle et al. | |

FOREIGN PATENT DOCUMENTS

| | | |
|---|---|---|
| JP | 10265766 | 10/1998 |
| JP | 11116948 | 4/1999 |
| JP | 2000-144109 | 5/2000 |
| JP | 2001-031953 | 2/2001 |
| JP | 2003-193038 | 7/2003 |
| JP | 2003-197573 | 7/2003 |
| WO | 9804646 | 2/1998 |
| WO | 2004072199 A3 | 8/2004 |

* cited by examiner

POLISHING COMPOSITION AND POLISHING METHOD

CROSS-REFERENCE TO RELATED APPLICATIONS

This application is a Continuation application from Ser. No. 11/065,238 filed Feb. 24, 2005, now abandoned, which claims the benefit of JP 2004-055318 filed Feb. 27, 2004, the contents of each which are incorporated by reference.

BACKGROUND OF THE INVENTION

The present invention relates to a polishing composition used, for example, in polishing for forming conductor wiring for a semiconductor device, and to a polishing method using such a polishing composition.

Currently, a damascene process wherein a chemical mechanical polishing (CMP) technology is used has become the main method for forming conductor wiring for a semiconductor device. When the conductor wiring is formed, first of all, a trench is formed on an insulator layer provided on a semiconductor substrate, and then a barrier layer comprising titanium or titanium nitride is formed on the insulator layer. Subsequently, a conductor layer is formed on the barrier layer such that at least the trench is filled with the conductor layer, and then a portion of the conductor layer and a portion of the barrier layer, each of which is positioned outside the trench, are removed by chemical mechanical polishing, whereby a portion of the conductor layer, which is left on the insulator layer, positioned inside the trench functions as the conductor wiring.

Japanese National Phase Laid-Open Patent Publication No. 2000-501771, Japanese Laid-Open Patent Publication Nos. 10-67986, 10-265766 and 11-116948 disclose a conventional polishing composition used in polishing for removing a portion of a conductor layer and a portion of a barrier layer, each of which is positioned outside a trench. However, conventional polishing compositions do not have the ability to polish a barrier layer comprising titanium at a high stock removal rate Furthermore, conventional polishing compositions have the problem of reduction in safety due to the addition of fluoride and the problem of metallic contamination of the semiconductor device due to the addition of a metallic catalyst.

The polishing for removing the portion of the conductor layer and the portion of the barrier layer, each of which is positioned outside the trench, may be carried out with two or more types of polishing compositions. More specifically, polishing compositions different from each other may be used in the steps of: removing a part of the portion of the conductor layer positioned outside the trench in order to expose the upper surface of the barrier layer, and removing the residual of the portion of the conductor layer positioned outside the trench and the portion of the barrier layer positioned outside the trench in order to expose the upper surface of an insulator layer. However, the above method requires a lot of work to provide the two or more types of polishing compositions, and a lot of work to replace the polishing compositions, whereby working efficiency is decreased.

SUMMARY OF THE INVENTION

Accordingly, an object of the present invention is to provide a polishing composition having the ability to polish a titanium material at a high stock removal rate, and to provide a polishing method using such a polishing composition.

To achieve the foregoing and other objectives and in accordance with the purpose of the present invention, a polishing composition is provided. The polishing composition, for use in an application for polishing a titanium-containing object, includes more than 0.1% by mass of colloidal silica, and water, and has a pH of 6 or less.

The present invention also provides a polishing method. The method includes preparing the above polishing composition and polishing a titanium-containing object, by using the prepared polishing composition.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

Each of FIGS. 1 and 2 is a cross-sectional view for illustrating a polishing method according to one embodiment of the present invention.

DETAILED DESCRIPTION OF THE PREFERRED EMBODIMENTS

Figure 1:
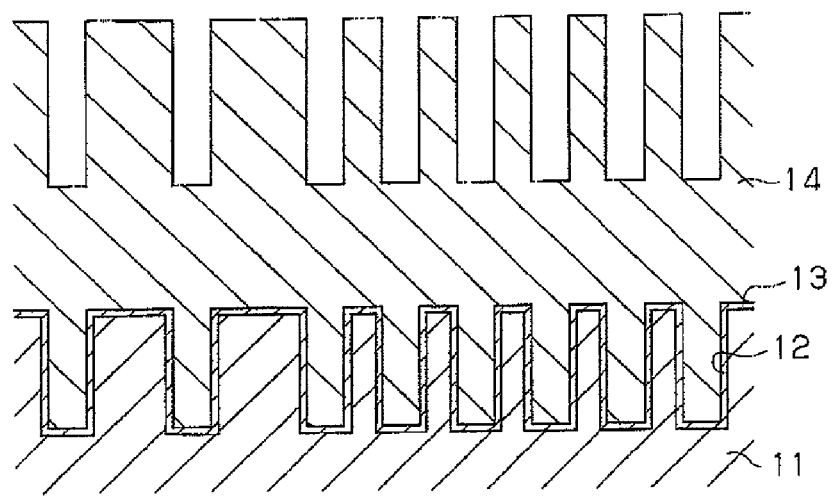
Figure 2:
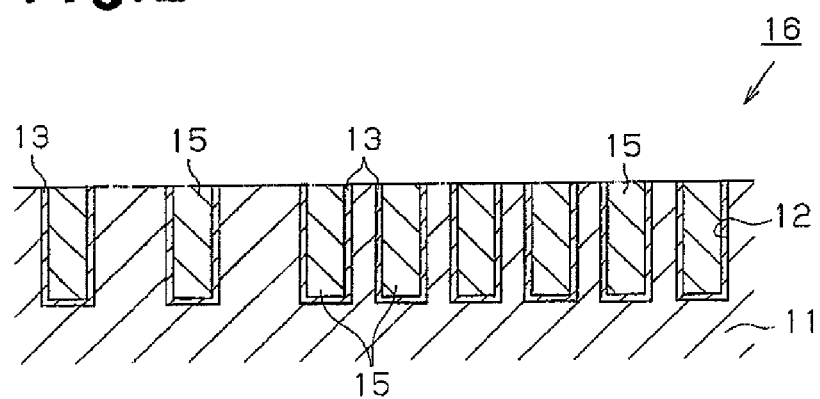

One embodiment of the present invention will now be described with reference to FIGS. 1 and 2.

First of all, a method for forming conductor wiring 15 (see FIG. 2) on a semiconductor device will be described. When the conductor wiring 15 of a semiconductor device is formed, as shown in FIG. 1, first a barrier layer 13 and a conductor layer 14 are formed on an insulator layer 11 having a trench 12. The insulator layer 11 may be any one of a $SiO_2$ film such as a TEOS film, a BSG film, a PSG film, and a BPSG film; a SiOF film; and a SiOC film. The trench 12 is formed, for example, according to a lithography technology and a pattern etching technology, which are publicly known, such that a predetermined design pattern can be provided.

The barrier layer 13 is formed on the insulator layer 11 such that the surface of the insulator layer 11 is covered with the barrier layer 13, prior to forming the conductor layer 14. The barrier layer 13 is formed, for example, according to a PVD method or a CVD method. The barrier layer 13 is formed from a titanium compound such as titanium nitride, titanium, or a titanium alloy. The barrier layer 13 may be, for example, a single-layer structure comprising a titanium layer or a titanium nitride layer, or a two-layer structure comprising a titanium layer and a titanium nitride layer, or a three-layer structure comprising two titanium layers and a titanium nitride layer interposed between the two titanium layers. The thickness of the barrier layer 13 is preferably sufficiently thin as compared to the depth of the trench 12.

The conductor layer 14 is formed on the barrier layer 13 such that at least the trench 12 is filled with the conductor layer 14. The conductor layer 14 is formed, for example, according to a PVD method, a CVD method, or a metalizing plating method. The conductor layer 14 is formed from a conductive metal such as tungsten, copper, aluminum, ruthenium, platinum, gold, hafnium, cobalt, and nickel. The conductor layer 14 is preferably formed from tungsten, copper or aluminum, since such a metal is high in electrical conductivity.

Subsequently, a portion of the conductor layer 14 and a portion of the barrier layer 13, each of which is positioned outside the trench 12, are removed by chemical mechanical polishing. Consequently, as shown in FIG. 2, the other portion of the barrier layer 13 and the other portion of the conductor layer 14, each of which is positioned inside the trench 12, are left on the insulator layer 11. The portion of the conductor layer 14 positioned inside the trench 12 functions as the conductor wiring 15. The portion of the barrier layer 13 positioned inside the trench 12 serves to prevent the diffusion of metal atoms in the conductor wiring 15 into the insulator layer 11.

The chemical mechanical polishing for removing the portion of the barrier layer 13 and the portion of the conductor layer 14, each of which is positioned outside the trench 12, is carried out at the first to third polishing steps. In the first polishing step, a part of the portion of the conductor layer 14 positioned outside the trench 12 is removed by chemical mechanical polishing. The polishing in the first polishing step is completed before the barrier layer 13 is exposed In the subsequent second polishing step, another part of the portion of the conductor layer 14 positioned outside the trench 12 is removed by chemical mechanical polishing such that the upper surface of the barrier layer 13 is exposed. In the subsequent third polishing step, the residual part of the portion of the conductor layer 14 positioned outside the trench 12, and the portion of the barrier layer 13 positioned outside the trench 12 are removed by chemical mechanical polishing such that the upper surface of the insulator layer 11 is exposed.

A polishing composition according to the present embodiment can be used in any of the first to third steps. Particularly in the third step, the polishing composition is preferably used. The polishing composition includes colloidal silica, an oxidizing agent, and water.

Colloidal silica in the polishing composition has an action for mechanically polishing an object, in particular, an action for rapidly polishing a titanium material. Colloidal silica synthesized by a sol-gel process includes impurity elements in a very small amount, and thus colloidal silica to be contained in the polishing composition is preferably synthesized by a sol-gel process. The synthesis of colloidal silica according to a sol-gel process comprises dripping methyl silicate into a solvent comprising methanol, ammonia and water so as to hydrolyze the methyl silicate. When it is not strictly necessary to consider contamination by impurity elements, colloidal silica to be contained in the polishing composition may be synthesized by an ion-exchange method. When colloidal silica is synthesized by an ion-exchange method, sodium silicate is used as a starting material.

From the viewpoint of enhancing the ability of the polishing composition to polish a titanium material, the average particle size of colloidal silica is preferably 1 nm or more, and more preferably 5 nm or more. On the other hand, from the viewpoint of suppressing the occurrence of a phenomenon referred to as "erosion" by which the level of the upper surface of an area in which a trench 12 is thickly formed is lowered, the average particle size of colloidal silica is preferably 25 nm or less, and more preferably 20 nm or less. It is because the ability of the polishing composition to polish the insulator layer 11 is moderately decreased that the occurrence of erosion is suppressed when the average particle size of colloidal silica is 25 nm or less, or 20 nm or less. The average particle size of colloidal silica can be determined by a specific surface area of the colloidal silica, as measured by a BET method, and a particle density of the colloidal silica.

It is necessary that the content of colloidal silica in the polishing composition be more than 0.1% by mass in order that the polishing composition can have the ability to polish a titanium material at a high stock removal rate. From the viewpoint of enhancing the ability of the polishing composition to polish a titanium material, the content of colloidal silica in the polishing composition is preferably 0.2% by mass or more, more preferably 0.25% by mass or more, and most preferably 0.35% by mass or more. On the other hand, from the viewpoint of enhancing the dispersion stability of the polishing composition and suppressing the aggregation of colloidal silica, the content of colloidal silica in the polishing composition is preferably 1.0% by mass or less, more preferably 0.75% by mass or less, and most preferably 0.65% by mass or less.

The oxidizing agent in the polishing composition has the action of oxidizing the conductive metal so as to promote the mechanical polishing of a conductive metal by using colloidal silica. Since periodic acid includes no impurity metal, an oxidizing agent to be contained in the polishing composition is preferably periodic acid. The periodic acid has the action of strongly promoting the mechanical polishing of a tungsten, ruthenium, platinum, and hafnium material. The periodic acid may be any one of orthoperiodic acid ($H_5IO_6$), metaperiodic acid ($HIO_4$), di-mesoperiodic acid ($H_4I_2O_9$), mesoperiodic acid ($H_3IO_5$), and di-orthoperiodic acid ($H_8I_2O_{11}$). Preferably, the periodic acid is orthoperiodic acid, because it is stable in composition, and easily available.

From the viewpoint of enhancing the ability of the polishing composition to polish a conductive metal, the content of an oxidizing agent in the polishing composition is preferably 0.5% by mass or more, and more preferably 1.0% by mass or more. On the other hand, from the viewpoint of suppressing the occurrence of erosion, the content of an oxidizing agent in the polishing composition is preferably 3.0% by mass or less, and more preferably 2.0% by mass or less. It is because the ability of the polishing composition to polish the conductor layer 14 and the insulator layer 11 is moderately decreased that the occurrence of erosion is suppressed when the content of the oxidizing agent is 3.0% by mass or less, or 2.0% by mass or less.

Water in the polishing composition acts as a medium for dispersing or dissolving components in the polishing composition, except water. Water to be included in the polishing composition should include minimal impurities, and thus it is preferably pure water, extra pure water, or distilled water.

The polishing composition of the present embodiment is prepared by mixing colloidal silica and an oxidizing agent with water. The mixing may be carried out by using a wing-type stirring machine or an ultrasonic dispersion-mixer.

To the polishing composition of the present embodiment, fumed oxide-particles may be added. When the fumed oxide-particles are added to the polishing composition, the ability of the polishing composition to polish a conductive metal is enhanced. The fumed oxide-particles have the action of mechanically polishing an object, in particular, the action of rapidly polishing a conductive metal.

The fumed oxide-particles can be synthesized by vapor-phase hydrolysis of chloride in oxyhydrogen flame. The fumed oxide-particles include an impurity metal merely in a relatively small amount, and have a chain structure wherein several to dozens of the particles are three-dimensionally aggregated.

The fumed metal oxide-particle to be added to the polishing composition may be any of fumed silica, fumed alumina, fumed titania, and fumed zirconia. Among them, fumed silica and fumed alumina are particularly high in the ability to polish a conductive metal. In particular, fumed silica is excellent in stability when it coexists with colloidal silica. Therefore, the fumed oxide-particles to be added to the polishing composition are preferably fumed silica or fumed alumina, and more preferably fumed silica.

From the viewpoint of enhancing the ability of the polishing composition to polish a conductive metal, the average particle size of the fumed oxide-particles to be added to the polishing composition is preferably 15 nm or more, and more preferably 21 nm or more. On the other hand, from the viewpoint of suppressing the occurrence of erosion, the average particle size of the fumed oxide-particles to be added to the polishing composition is preferably 45 nm or less, and more preferably 39 nm or less. It is because the ability of the polishing composition to polish the insulator layer 11 is moderately decreased that the occurrence of erosion is suppressed when the average particle size of the fumed oxide-particles to be added to the polishing composition is 45 nm or less, or 39 nm or less. The average particle size of the fumed oxide-particles can be determined by a specific surface area of the colloidal silica, as measured by a BET method, and a particle density of the colloidal silica in a manner similar to the case of the average particle size of colloidal silica.

From the viewpoint of enhancing the ability of the polishing composition to polish a conductive metal, the content of fumed oxide-particles in the polishing composition to which the fumed oxide-particles are added is preferably 0.5% by mass or more, more preferably 2.5% by mass or more, and most preferably 3.5% by mass or more. On the other hand, from the viewpoints of enhancing the dispersion stability of the polishing composition and suppressing the aggregation of the fumed oxide-particles, the content of the fumed oxide-particles in the polishing composition to which the fumed oxide-particles are added is preferably 10% by mass or less, more preferably 7.5% by mass or less, and most preferably 6.5% by mass or less.

When the fumed oxide-particles are added to the polishing composition, the ratio of weight of the fumed oxide-particles in the polishing composition to the total weight of the colloidal silica and the fumed oxide-particles in the polishing composition is preferably in the range of 77 to 97%, and more preferably 84 to 95%. When the ratio is set in the range above, both the ability of the polishing composition to polish a titanium material and the ability of the polishing composition to polish a conductive metal are particularly remarkably enhanced.

To the polishing composition of the present embodiment, a polishing aid that serves to promote the action of the oxidizing agent may be added. The polishing aid to be added to the polishing composition is preferably a metal salt having oxidative power, or ammonium nitrate. Ammonium nitrate has the advantage of having moderate oxidative power and including no impurity metals.

From the viewpoint of strongly promoting the action of the oxidizing agent, the content of the polishing aid in the polishing composition to which the polishing aid is added is preferably 0.25% by mass or more, and more preferably 0.35% by mass or more, On the other hand, from the viewpoint of inhibiting corrosion by the polishing composition, of an object to be polished, the content of the polishing aid in the polishing composition to which the polishing aid is added is preferably 1.25% by mass or less, more preferably 0.75% by mass or less, and most preferably 0.65% by mass or less.

It is absolutely necessary that the pH of the polishing composition of the present embodiment be 6 or less in order that the polishing composition can have the ability to polish a titanium material at a high stock removal rate. From the viewpoint of enhancing the dispersion stability of the polishing composition and suppressing the aggregation of colloidal silica, the pH of the polishing composition is preferably 4.5 or less, and more preferably 3.0 or less. On the other hand, from the viewpoint of suppressing the occurrence of erosion, enhancing ease in handle the polishing composition, and preventing equipment used at the time of polishing from corrosion, the pH of the polishing composition is preferably 1.1 or more, and more preferably 2.0 or more.

In order to adjust the pH of the polishing composition to a desirable value, a pH adjuster may be added to the polishing composition of the present embodiment. As the pH adjuster to be added to the polishing composition, a basic compound containing no metallic impurities is preferred, and specifically ammonia, an ammonium salt, amine, a quaternary ammonium salt, or quaternary ammonium hydroxide can be enumerated. Among them, in particular, quaternary ammonium hydroxide such as tetramethylammonium hydroxide is preferred because of its ease in handling.

To the polishing composition of the present embodiment, a corrosion inhibitor may be added. When the corrosion inhibitor was added to the polishing composition, corrosion of the conductor layer 14 by the polishing composition is inhibited. As the corrosion inhibitor to be added to the polishing composition, benzotriazole or its derivatives are preferred. Benzotriazole and its derivatives have the advantage of showing a strong anticorrosive action even in a small amount, as well as containing no metal element impurities.

From the viewpoint of strongly inhibiting corrosion of the conductor layer 14 by the polishing composition, the content of the corrosion inhibitor in the polishing composition to which the corrosion inhibitor is added is preferably 0.001% by mass or more, and more preferably 0.003% by mass or more. On the other hand, from the viewpoint of suppressing reduction in the ability of the polishing composition to polish a conductive metal, the content of the corrosion inhibitor in the polishing composition to which the corrosion inhibitor is added is preferably 0.2% by mass or less, and more preferably 0.12% by mass or less.

To the polishing composition of the present embodiment, a surface active agent may be added. When the surface active agent was added to the polishing composition, the occurrence of a phenomenon referred to as "dishing" is suppressed, wherein the level of the top surface of the conductor wiring 15 is lowered. As the surface active agent to be added to the polishing composition, an anionic surface-active agent or a nonionic surface-active agent is preferred. Specifically, the anionic surface-active agents include a carboxylate such as soap, a N-acylamino acid salt, polyoxyethylene alkyl ether carboxylate, polyoxypropylene alkyl ether carboxylate, and an acylated peptide; a sulfonate such as alkyl sulfonate, alkylbenzene sulfonate, alkylnaphthalene sulfonate, naphthalene sulfonate, sulfosuccinate, α-olefin sulfonate, and N-acyl sulfonate; a sulfuric ester such as sulfated oil, alkyl sulfate, alkyl ether sulfate, polyoxyethylene alkylallyl ether sulfate, polyoxypropylene alkylallyl ether sulfate, and alkylamide sulfate; and a phosphoric ester such as alkyl phosphate, polyoxyethylene alkylallyl ether phosphate, and polyoxypropylene alkylallyl ether phosphate. Specifically, the nonionic surface-active agents include an ether type such as polyoxyethylene alkylphenyl ether, alkyl phenyl ether, alkylallyl formaldehyde-condensed polyoxyethylene ether, polyoxyethylene-polyoxypropylene block polymer, and polyoxyethylene-polyoxypropylene alkyl ether; an ether-ester type such as polyoxyethylene ether of glycerin ester, polyoxyethylene ether of sorbitan ester, and polyoxyethylene ether of sorbitol ester; and an ester type such as poly(ethylene glycol) fatty acid ester, glycerin ester, polyglycerin ester, sorbitan ester, propylene glycol ester, sucrose ester, methoxy acetate, ethoxy acetate, 3-ethoxy propionate, and alanine ethyl ester. The nonionic surface-active agents may be an ether such as poly (ethylene glycol), poly(propylene glycol), poly(tetramethylene glycol), poly(ethylene glycol) alkyl ether, poly(ethylene glycol) alkenyl ether, alkyl poly(ethylene glycol), alkyl poly (ethylene glycol) alkyl ether, alkyl poly(ethylene glycol) alkenyl ether, alkenyl poly(ethylene glycol), alkenyl poly(ethylene glycol) alkyl ether, alkenyl poly(ethylene glycol) alkenyl ether, poly(propylene glycol) alkyl ether, poly(propylene glycol) alkenyl ether, alkyl poly(propylene glycol), alkyl poly (propylene glycol) alkyl ether, alkyl poly(propylene glycol) alkenyl ether, alkenyl poly(propylene glycol), alkenyl poly (propylene glycol) alkyl ether, and alkenyl poly(propylene glycol) alkenyl ether; a polycarboxylic acid or a salt thereof, such as poly(aspartic acid), poly(glutamic acid), polylysine, poly(malic acid), poly(methacrylic acid), poly(ammonium methacrylate), poly(sodium methacrylate), polyamide acid, poly(maleic acid), poly(itaconic acid), poly(fumaric acid), poly(p-styrene carboxylic acid), poly(acrylic acid), polyacrylamide, amino-polyacrylamide, poly(ammonium acrylate), poly(sodium acrylate), poly(amide acid), a poly(amide acid) ammonium salt, a poly(amide acid) sodium salt, and polyglyoxylic acid; a vinyl polymer such as poly(vinyl alcohol), poly(vinylpyrrolidone), and polyacrolein; or sulfonic acid or a salt thereof, such as ammonium methyl taurate, sodium methyl taurate, sodium methyl sulfate, ammonium ethyl sulfate, ammonium butyl sulfate, sodium vinyl sulfonate, sodium 1-allyl sulfonate, sodium 2-allyl sulfonate, sodium methoxymethyl sulfonate, ammonium ethoxymethyl sulfonate, sodium 3-ethoxypropyl sulfonate, and sodium sulfosuccinate. Among them, polycarboxylic acid and an ammonium salt thereof are preferred, because of their strong action for suppressing the occurrence of dishing.

To the polishing composition of the present embodiment, an organic solvent may be added. The organic solvent acts as a medium for dispersing or dissolving a component(s) in the polishing composition, in particular a component(s) which is low in water solubility and water dispersibility. As the organic solvents to be added to the polishing composition, for example, alcohols such as methanol and isopropanol, glycols such as ethylene glycol, and propylene glycol can be enumerated. The content of the organic solvent in the polishing composition to which the organic solvent is added is preferably 0.5% by mass or less.

In the polishing composition of the present embodiment, the concentration (mass fraction) of each of elements belonging to the group 2 to the group 12 of the periodic table, and aluminum, gallium, indium, thallium, tin, lead, and bismuth (among them, in particular, the concentration (mass fraction) of each of copper, iron, nickel, chromium, and manganese) is preferably 100 ppb or less, and more preferably 50 ppb or less. The notation of the group numbers above is based upon IUPAC nomenclature for inorganic chemicals (revised edition) (1989). The above concentration can be determined, for example, by using an inductively coupled plasma mass spectrometer (ICP-MS), an inductively coupled plasma atomic emission spectrometer (ICP-AES), an atomic absorption spectrometer, or a total reflection X-ray fluorescence analyzer (TXRF).

When the polishing composition of the present embodiment is used for chemically and mechanically polishing the portion of the conductor layer 14 and the portion of the barrier layer 13, each of which is positioned outside a trench 12 (see FIG. 1), for removal of the portions, the surface of the conductor layer 14 is oxidized by the action of the oxidizing agent, whereby the surface of the conductor layer 14 is embrittled, and the embrittled surface of the conductor layer 14 is polished and removed by the action of colloidal silica.

Thus the polishing composition of the present embodiment has the ability to polish the conductor layer 14 at a high stock removal rate. When the conductor layer 14 is formed from tungsten, tungsten on the surface portion of the conductor layer 14 is oxidized into tungsten trioxide, whereby the surface of the conductor layer 14 is embrittled. Furthermore, the polishing composition of the present embodiment includes more than 0.1% by mass of colloidal silica which has the action of rapidly polishing titanium material. Thus, when the barrier layer 13 is formed from titanium, the polishing composition of the present embodiment has also the ability to polish the barrier layer 13 at a high stock removal rate.

Thus the polishing composition of the present embodiment has the ability to polish both of the barrier layer 13 and the conductor layer 14 at a high stock removal rate. Therefore, the polishing for removing the portion of the conductor layer 14 and the portion of the barrier layer 13, each of which is positioned outside the trench 12, may be carried out by using only the polishing composition of the present embodiment without using two or more types of polishing compositions. When the polishing for removing the portion of the conductor layer 14 and the portion of the barrier layer 13, each of which is positioned outside the trench 12, was carried out by using only the polishing composition of the present embodiment, working efficiency will be enhanced, because a lot of work to provide the two or more types of polishing compositions or a lot of work to replace the polishing compositions is not required.

The present invention may be embodied in the following forms.

The polishing composition of the above embodiment may be used in applications for polishing an object formed from titanium, such as a titanium target material for spattering, a titanium material for vapor deposition, or a titanium dummy wafer for a semiconductor. When the object to be polished is formed from titanium, a polishing composition in accordance with the embodiment may not necessarily include an oxidizing agent.

The polishing composition may be prepared by diluting an undiluted polishing composition. This case is advantageous, because the polishing composition can be preserved and transported in the form of the undiluted polishing composition with less volume than the polishing composition.

The polishing composition may be prepared by mixing an oxidizing agent with other components of the polishing composition than the oxidizing agent immediately before using the polishing composition. In this case, decomposition of the oxidizing agent during preservation will be inhibited.

To the polishing composition, an aqueous polymer, a chelating agent, an antiseptic agent and the like may be added.

Hereinafter, examples and comparative examples of the present invention will be described.

Each of fumed oxide-particles, colloidal silica, orthoperiodic acid (oxidizing agent), tetramethylammonium hydroxide (pH adjuster), ammonium nitrate (polishing aid), poly (acrylic acid) (surface active agent), and benzotriazole (corrosion inhibitor) were added to water according to need so as to prepare polishing compositions according to Examples 1 to 32 and Comparative Examples 1 to 5. Particulars about the components of each of the polishing compositions, and the pH of each of the polishing compositions are as shown in Table 1.

Under the following polishing conditions, each of a tungsten blanket-wafer, a titanium blanket-wafer, a titanium nitride blanket-wafer, and a silicon oxide (TEOS) blanket-wafer was polished by using each of the polishing compositions. The thickness of each of the blanket wafers before and after polishing was determined by means of a sheet-resistance measuring apparatus "VR-120" manufactured by Kokusai Electric System Service Co., Ltd. Then the stock removal rate of each of the polishing compositions to each of the wafers was determined by dividing the thickness diminution, which is the difference in thickness between the wafer before polishing and the wafer after polishing, by polishing time. The results are shown in the column entitled "Stock removal rate for Tungsten", the column entitled "Stock removal rate for Titanium", the column entitled "Stock removal rate for Titanium Nitride", and the column entitled "Stock removal rate for TEOS" of Table 2. Furthermore, the ratio of a stock removal rate for tungsten to a stock removal rate for titanium is shown in the column entitled "Tungsten/Titanium" of Table 2; the ratio of a stock removal rate for tungsten to a stock removal rate for titanium nitride is shown in the column entitled "Tungsten/Titanium Nitride" thereof; and the ratio of a stock removal rate for tungsten to a stock removal rate for TEOS is shown in the column entitled "Tungsten/TEOS" thereof.

<Polishing Conditions>

Polishing Machine: Single-sided CMP Polishing Machine "Mirra" of Applied Materials Inc.
Polishing Pad: Polyurethane Laminated Polishing Pad "IC-1400 k-groove" of Rodel Inc.
Polishing Pressure: 28 kPa (=approximately 4 psi)
Revolution Speed of Surface Table: 123 revolutions/min.
Feed Speed of Polishing Composition: 125 ml/min.
Revolution Speed of Carrier: 121 revolutions/min.
Polishing Time: One minute

TABLE 1

| | Fumed oxide-particles [mass percentage in polishing composition] | Colloidal silica [mass percentage in polishing composition] | Orthoperiodic acid [mass percentage in polishing composition] | Tetramethylammonium hydroxide [mass percentage in polishing composition] | Ammonium nitrate [mass percentage in polishing composition] | Poly(acrylic acid) [mass percentage in polishing composition] | Benzotriazole [mass percentage in polishing composition] | pH |
|---|---|---|---|---|---|---|---|---|
| Ex. 1 | 0.5 *1 | 0.5 *5 | 1.5 | 0.5 | 0.5 | 0.25 | — | 2.8 |
| Ex. 2 | 2.5 *1 | 0.5 *5 | 1.5 | 0.5 | 0.5 | 0.25 | — | 2.8 |
| Ex. 3 | 5 *1 | 0.5 *5 | 1.5 | 0.5 | 0.5 | 0.25 | — | 2.8 |
| Ex. 4 | 7.5 *1 | 0.5 *5 | 1.5 | 0.5 | 0.5 | 0.25 | — | 2.8 |
| Ex. 5 | 10 *1 | 0.5 *5 | 1.5 | 0.5 | 0.5 | 0.25 | — | 2.8 |
| Ex. 6 | 5 *1 | 0.25 *5 | 1.5 | 0.5 | 0.5 | 0.25 | — | 2.8 |
| Ex. 7 | 5 *1 | 0.75 *5 | 1.5 | 0.5 | 0.5 | 0.25 | — | 2.8 |
| Ex. 8 | 5 *1 | 1.0 *5 | 1.5 | 0.5 | 0.5 | 0.25 | — | 2.8 |
| Ex. 9 | 2 *1 | 0.8 *5 | 1.5 | 0.5 | 0.5 | 0.25 | — | 2.8 |
| Ex. 10 | 4 *1 | 0.6 *5 | 1.5 | 0.5 | 0.5 | 0.25 | — | 2.8 |
| Ex. 11 | 6 *1 | 0.4 *5 | 1.5 | 0.5 | 0.5 | 0.25 | — | 2.8 |
| Ex. 12 | 8 *1 | 0.2 *5 | 1.5 | 0.5 | 0.5 | 0.25 | — | 2.8 |
| Ex. 13 | 5 *2 | 0.5 *5 | 1.5 | 0.5 | 0.5 | 0.25 | — | 2.8 |
| Ex. 14 | 5 *3 | 0.5 *5 | 1.5 | 0.5 | 0.5 | 0.25 | — | 2.8 |
| Ex. 15 | 5 *1 | 0.5 *6 | 1.5 | 0.5 | 0.5 | 0.25 | — | 2.8 |
| Ex. 16 | 5 *1 | 0.5 *7 | 1.5 | 0.5 | 0.5 | 0.25 | — | 2.8 |
| Ex. 17 | 5 *1 | 0.5 *5 | 0.5 | 0.5 | 0.5 | 0.25 | — | 4.5 |
| Ex. 18 | 5 *1 | 0.5 *5 | 1.0 | 0.5 | 0.5 | 0.25 | — | 3.5 |
| Ex. 19 | 5 *1 | 0.5 *5 | 2.0 | 0.5 | 0.5 | 0.25 | — | 2.2 |
| Ex. 20 | 5 *1 | 0.5 *5 | 3.0 | 0.5 | 0.5 | 0.25 | — | 2.0 |
| Ex. 21 | 5 *1 | 0.5 *5 | 1.5 | 0.5 | — | 0.25 | — | 2.8 |
| Ex. 22 | 5 *1 | 0.5 *5 | 1.5 | 0.5 | 0.25 | 0.25 | — | 2.8 |
| Ex. 23 | 5 *1 | 0.5 *5 | 1.5 | 0.5 | 0.75 | 0.25 | — | 2.8 |
| Ex. 24 | 5 *1 | 0.5 *5 | 1.5 | 0.5 | 1.0 | 0.25 | — | 2.8 |
| Ex. 25 | 5 *1 | 0.5 *5 | 1.5 | 0.5 | 1.25 | 0.25 | — | 2.8 |
| Ex. 26 | 5 *1 | 0.5 *5 | 1.5 | 0.5 | 0.5 | — | — | 2.8 |
| Ex. 27 | 5 *1 | 0.5 *5 | 1.5 | 0.5 | 0.5 | — | 0.003 | 2.8 |
| Ex. 28 | 5 *1 | 0.5 *5 | 1.5 | — | 0.5 | 0.25 | — | 1.1 |
| Ex. 29 | 5 *1 | 0.5 *5 | 1.5 | 0.25 | 0.5 | 0.25 | — | 1.5 |
| Ex. 30 | 5 *1 | 0.5 *5 | 1.5 | 0.75 | 0.5 | 0.25 | — | 4.5 |
| Ex. 31 | — | 0.5 *5 | 1.5 | 0.5 | 0.5 | 0.5 | — | 2.8 |
| Ex. 32 | 5 *4 | 0.5 *5 | 1.5 | 0.5 | 0.5 | 0.5 | — | 2.8 |
| C. Ex. 1 | — | — | 1.5 | 0.5 | 0.5 | 0.5 | — | 2.8 |
| C. Ex. 2 | 5 *1 | — | 1.5 | 0.5 | 0.5 | 0.5 | — | 2.8 |
| C. Ex. 3 | 10 *4 | — | 1.5 | 0.5 | 0.5 | 0.5 | — | 2.8 |
| C. Ex. 4 | 5 *1 | 0.1 *5 | 1.5 | 0.5 | 0.5 | 0.25 | — | 2.8 |
| C. Ex. 5 | 5 *1 | 0.5 *5 | — | 0.5 | 0.5 | 0.5 | — | 10.5 |

*1 Fumed silica having an average particle size of 30 nm
*2 Fumed silica having an average particle size of 55 nm
*3 Fumed silica having an average particle size of 20 nm
*4 Fumed alumina having an average particle size of 30 nm
*5 Colloidal silica having an average particle size of 10 nm
*6 Colloidal silica having an average particle size of 20 nm
*7 Colloidal silica having an average particle size of 35 nm

TABLE 2

|  | Stock removal rate for Tungsten [nm/min] | Stock removal rate for Titanium [nm/min] | Stock removal rate for Titanium Nitride [nm/min] | Stock removal rate for TEOS [nm/min] | Tungsten/Titanium | Tungsten/Titanium Nitride | Tungsten/TEOS |
|---|---|---|---|---|---|---|---|
| Ex. 1 | 230 | 50 | 160 | 2 | 4.6 | 1.4 | 115.0 |
| Ex. 2 | 300 | 83 | 280 | 5 | 3.6 | 1.1 | 60.0 |
| Ex. 3 | 380 | 85 | 370 | 10 | 4.5 | 1.0 | 38.0 |
| Ex. 4 | 400 | 85 | 400 | 11 | 4.7 | 1.0 | 36.4 |
| Ex. 5 | 420 | 85 | 420 | 12 | 4.9 | 1.0 | 35.0 |
| Ex. 6 | 380 | 45 | 370 | 10 | 8.4 | 1.0 | 38.0 |
| Ex. 7 | 380 | 85 | 370 | 10 | 4.5 | 1.0 | 38.0 |
| Ex. 8 | 380 | 85 | 370 | 10 | 4.5 | 1.0 | 38.0 |
| Ex. 9 | 270 | 90 | 240 | 5 | 3.0 | 1.1 | 54.0 |
| Ex. 10 | 360 | 87 | 340 | 9 | 4.1 | 1.1 | 40.0 |
| Ex. 11 | 390 | 80 | 375 | 11 | 4.9 | 1.0 | 35.5 |
| Ex. 12 | 410 | 40 | 390 | 12 | 10.3 | 1.1 | 34.2 |
| Ex. 13 | 410 | 85 | 400 | 12 | 4.8 | 1.0 | 34.2 |
| Ex. 14 | 360 | 85 | 360 | 9 | 4.2 | 1.0 | 40.0 |
| Ex. 15 | 380 | 60 | 370 | 10 | 6.3 | 1.0 | 38.0 |
| Ex. 16 | 380 | 40 | 370 | 10 | 9.5 | 1.0 | 38.0 |
| Ex. 17 | 100 | 75 | 370 | 10 | 1.3 | 0.3 | 10.0 |
| Ex. 18 | 250 | 82 | 370 | 10 | 3.0 | 0.7 | 25.0 |
| Ex. 19 | 400 | 85 | 370 | 10 | 4.7 | 1.1 | 40.0 |
| Ex. 20 | 440 | 85 | 370 | 10 | 5.2 | 1.2 | 44.0 |
| Ex. 21 | 300 | 85 | 370 | 10 | 3.5 | 0.8 | 30.0 |
| Ex. 22 | 360 | 85 | 370 | 10 | 4.2 | 1.0 | 36.0 |
| Ex. 23 | 400 | 85 | 370 | 10 | 4.7 | 1.1 | 40.0 |
| Ex. 24 | 400 | 85 | 370 | 10 | 4.7 | 1.1 | 40.0 |
| Ex. 25 | 390 | 85 | 370 | 10 | 4.6 | 1.1 | 39.0 |
| Ex. 26 | 400 | 85 | 370 | 10 | 4.7 | 1.1 | 40.0 |
| Ex. 27 | 400 | 85 | 370 | 10 | 4.7 | 1.1 | 40.0 |
| Ex. 28 | 410 | 88 | 370 | 10 | 4.7 | 1.1 | 41.0 |
| Ex. 29 | 390 | 85 | 370 | 10 | 4.6 | 1.1 | 39.0 |
| Ex. 30 | 300 | 83 | 370 | 10 | 3.6 | 0.8 | 30.0 |
| Ex. 31 | 150 | 50 | 100 | 2 | 3.0 | 1.5 | 75.0 |
| Ex. 32 | 350 | 30 | 350 | 10 | 11.7 | 1.0 | 35.0 |
| C. Ex. 1 | 50 | 2 | 100 | 2 | 25.0 | 0.5 | 25.0 |
| C. Ex. 2 | 380 | 10 | 370 | 10 | 38.0 | 1.0 | 38.0 |
| C. Ex. 3 | 430 | 10 | 380 | 10 | 43.0 | 1.1 | 43.0 |
| C. Ex. 4 | 380 | 14 | 370 | 10 | 27.1 | 1.0 | 38.0 |
| C. Ex. 5 | 10 | 15 | 370 | 40 | 0.7 | 0.0 | 0.3 |

As shown in Table 2, in Comparative Examples 1 to 5, all of the stock removal rates for a titanium blanket-wafer are no greater than 15 nm/min. and most are less. From this result, it can be concluded that none of the polishing compositions according to Comparative Examples 1 to 5 have the ability to polish a titanium material at a high stock removal rate. The reason why the polishing compositions according to Comparative Examples 1 to 3 had a low stock removal rate when polishing the titanium blanket-wafer is believed to be that the polishing compositions according to Comparative Examples 1 to 3 included no colloidal silica. The reason why the polishing composition according to Comparative Example 4 had a low stock removal rate when polishing the titanium blanket-wafer is believed to be that the content of colloidal silica in the polishing composition in Comparative Example 4 was as low as 0.1% by mass (i.e., 0.1% by mass or less). The reason why the polishing composition according to Comparative Example 5 had a low stock removal rate when polishing the titanium blanket-wafer is believed to be that pH of the polishing composition according to Comparative Example 5 is 10.5, i.e., greater than 6.

In contrast, in Examples 1 to 32, all of the stock removal rates for a titanium blanket-wafer are as high as 30 nm/min., or more. From this result, it can be concluded that all of the polishing compositions according to Examples 1 to 32 have the ability to polish a titanium material at a high stock removal rate. Furthermore, from the results of Example 31 and Comparative Example 1, it can be concluded that the ability of a polishing composition to polish a tungsten material is enhanced by adding fumed silica to the polishing composition.

From the results of Examples 1 to 5, it can be concluded that the content of fumed silica is preferably 2.5% by mass or more in order to enhance the ability of the polishing composition to polish a titanium material while the content of fumed silica is preferably 4.0% by mass or more in order to enhance the ability of the polishing composition to polish a tungsten material. From the results of Example 3 and 6 to 8, it can be concluded that the content of colloidal silica is preferably 0.5% by mass or more in order to enhance the ability of the polishing composition to polish a titanium material. From the results of Examples 14 to 16, it can be concluded that the average particle size of colloidal silica is preferably 20 nm rather than 10 nm, and more preferably 35 nm rather than 20 nm in order to enhance the ability of the polishing composition to polish a titanium material. From the results of Examples 17 to 20, it can be found that the content of periodic acid is preferably 1.0% by mass or more in order to enhance the ability of the polishing composition to polish a titanium material while the content of periodic acid is preferably 1.5% by mass or more in order to enhance the ability of the polishing composition to polish a tungsten material.

The invention claimed is:
1. A method comprising:
preparing an object including an insulator layer having a trench, a barrier layer provided on the insulator layer, and a conductor layer provided on the barrier layer, wherein each of the barrier layer and the conductor layer has a portion positioned inside the trench and a portion positioned outside the trench;

preparing a polishing composition containing more than 0.1% by mass of colloidal silica, fumed oxide-particles having an average particle size of 45 nm or less, a periodic acid, and water, and having a pH of 6 or less, wherein the colloidal silica has an average particle size smaller than that of the fumed oxide-particles; and polishing the object, by using the polishing composition, to remove at least parts of the portions of the barrier layer and the conductor layer positioned outside the trench.

2. The method according to claim 1, wherein the barrier layer is formed from titanium nitride or titanium.

3. The method according to claim 1, wherein the conductor layer is formed from tungsten, copper, or aluminum.

4. The method according to claim 1, wherein the average particle size of the colloidal silica is in a range from 1 to 25 nm.

5. The method according to claim 1, wherein the fumed oxide-particles comprise fumed silica, fumed alumina, fumed titania, or fumed zirconia.

6. The method according to claim 1, wherein the average particle size of the fumed oxide-particles is in a range from 15 to 45 nm.

7. The method according to claim 1, wherein the ratio of weight of the fumed oxide-particles in the polishing composition to the total weight of the colloidal silica and the fumed oxide-particles in the polishing composition is in a range from 77 to 97%.

8. The method according to claim 1, wherein the polishing composition further contains ammonium nitrate.

9. The method according to claim 1, wherein the polishing composition further contains benzotriazole or its derivatives.

10. The method according to claim 1, wherein the polishing composition further contains a surface active agent.

11. The method according to claim 10, wherein the surface active agent is an anionic surface active agent or a nonionic surface active agent.

12. A method comprising:

preparing an object including an insulator layer having a trench, a titanium nitride or titanium barrier layer provided on the insulator layer, and a tungsten conductor layer provided on the barrier layer, wherein each of the barrier layer and the conductor layer has a portion positioned inside the trench and a portion positioned outside the trench;

preparing a polishing composition containing more than 0.1% by mass of colloidal silica, fumed oxide-particles having an average particle size of 45 nm or less, ortho-periodic acid, ammonium nitrate, and water, and having a pH of 6 or less, wherein the colloidal silica has an average particle size smaller than that of the fumed oxide-particles; and polishing the object, by using the polishing composition, to remove at least parts of the portions of the barrier layer and the conductor layer positioned outside the trench.

* * * * *

UNITED STATES PATENT AND TRADEMARK OFFICE
CERTIFICATE OF CORRECTION

PATENT NO. : 8,501,027 B2
APPLICATION NO. : 11/969493
DATED : August 6, 2013
INVENTOR(S) : Chiyo Horikawa et al.

It is certified that error appears in the above-identified patent and that said Letters Patent is hereby corrected as shown below:

On the Title page

Column 1, item (30) insert
--Foreign Application Priority Data
February 27, 2004   (JP)   2004-055318--

Signed and Sealed this
Fifteenth Day of October, 2013

Teresa Stanek Rea
*Deputy Director of the United States Patent and Trademark Office*